United States Patent [19]
Zhou et al.

[11] Patent Number: 5,795,699
[45] Date of Patent: Aug. 18, 1998

[54] LANGMUIR-BLODGETT (LB) FILMS AS ARC AND ADHESION PROMOTERS FOR PATTERNING OF SEMICONDUCTOR DEVICES

[75] Inventors: Mei Sheng Zhou, Singapore; Ron-Fu Chu, Amica, both of Singapore

[73] Assignee: Chartered Semiconductor Manufacturing Ltd., Singapore, Singapore

[21] Appl. No.: 679,858

[22] Filed: Jul. 15, 1996

[51] Int. Cl.$^6$ ................................................ G03C 5/00
[52] U.S. Cl. ...................... 430/318; 430/320; 430/325; 430/327; 438/939
[58] Field of Search ........................ 430/325, 318, 430/327, 320; 438/939

[56] References Cited

U.S. PATENT DOCUMENTS

| | | | |
|---|---|---|---|
| 4,297,436 | 10/1981 | Kubotera et al. | 430/310 |
| 5,225,274 | 7/1993 | Ogawa et al. | 428/333 |
| 5,301,069 | 4/1994 | Wood et al. | 359/890 |
| 5,449,639 | 9/1995 | Wei et al. | 437/187 |

FOREIGN PATENT DOCUMENTS 5-198501   8/1993   Japan.

OTHER PUBLICATIONS

Penner et al., "The formation of mixed J aggregates of cyanine dyes in Langmuir–Blodgett monlayers", Thin Solid Films, vol. 132, 1985, pp. 185–192.

Chen et al. MRS Bull. 1995, 20(6), pp. 36–45.

CAPLUS abstract of Hasmonay et al. Opt. Acta 1976, 23(8), 665–77. CAPLUS No. 584220.

English translation of JP 5-198501.

S.Wolf, "Silicon Processing for the VLSI ERA–vol. 1" Lattice Press, Sunset Beach, CA, 1986. p. 441.

*Primary Examiner*—Janet C. Baxter
*Assistant Examiner*—Rosemary Ashton
*Attorney, Agent, or Firm*—George O. Saile; Stephen B. Ackerman; Alek P. Szecsy

[57] ABSTRACT

A method for forming upon a reflective layer, such as a reflective conducting layer, within an integrated circuit an Anti-Reflective Coating (ARC) which simultaneously possesses adhesion promotion characteristics for an organic layer to be formed upon the reflective layer. There is first formed upon a semiconductor wafer a reflective integrated circuit layer which may be a hydrophilic reflective integrated circuit layer or a hydrophobic integrated circuit layer. The semiconductor wafer is then immersed into and withdrawn from a Langmuir trough having formed therein a Langmuir-Blodgett (LB) monolayer film of a dye surfactant molecule ordered upon a surface of water. Upon withdrawing the wafer from the Langmuir trough, there is formed upon the reflective integrated circuit layer an ordered LB film of the dye surfactant molecule. The chromophore groups within the dye surfactant molecule and ordered LB film provide ARC characteristics to the reflective layer.

26 Claims, 7 Drawing Sheets

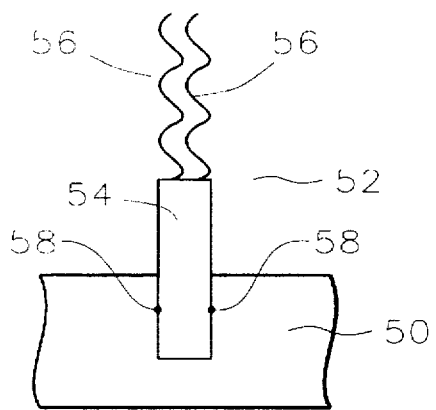
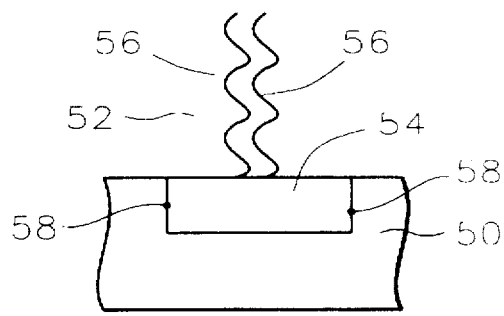
FIG. 3A          FIG. 3B
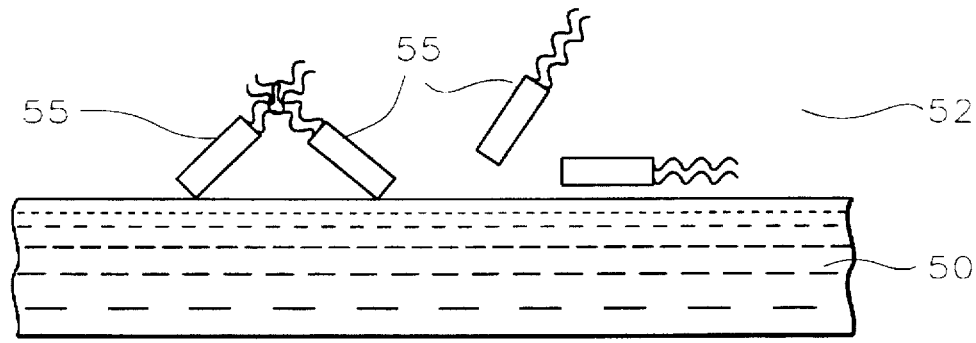
FIG. 4
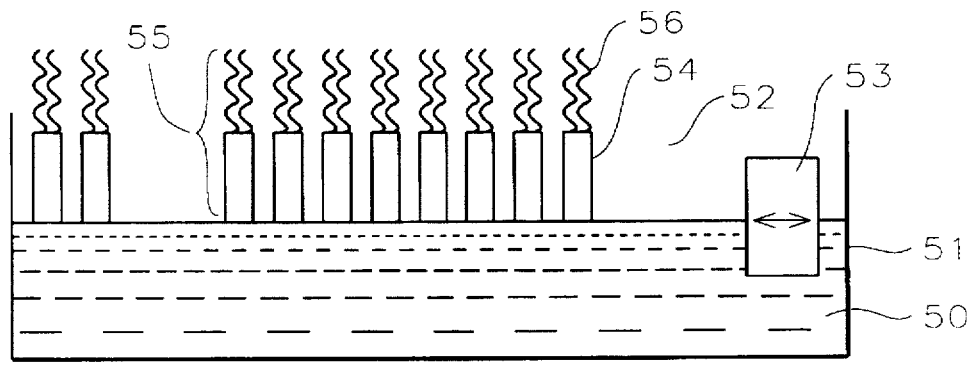
FIG. 5

LANGMUIR-BLODGETT (LB) FILMS AS ARC AND ADHESION PROMOTERS FOR PATTERNING OF SEMICONDUCTOR DEVICES

BACKGROUND OF THE INVENTION (1) Field of the Invention

The invention relates to the fabrication of integrated circuit devices, and more particularly, to a method of simultaneously providing an antireflective coating and adhesion promoter for the patterning of reflective layers in semiconductor devices or the like.

(2) Description of the Prior Art

In the fabrication of integrated circuits, a layer of photoresist is coated over an underlying layer or layers to be patterned. The photoresist is exposed to actinic light through a mask. The photoresist is developed leaving a pattern which is then used to pattern the underlying layers. If the topmost underlying layer is highly reflective, the light rays are reflected by the underlying layer onto the photoresist layer causing overexposure of portions of the photoresist layer. This will result in inaccurate patterning of the underlying layers. Current practice in the art is to use an anti-reflective coating (ARC) under the photoresist. This coating is typically formed from titanium nitride, although polymer films which are highly absorbing and non-bleaching at photoexposure wavelengths have also been used. However, neither titanium nitride nor polymers typically employed as ARCs can serve as both anti-reflective coatings and adhesion promoters.

In addition to the overexposure of portions of photoresist layers formed upon reflective layers within integrated circuits, there also exists within integrated circuits the substantially unrelated problem of providing adequate adhesion between organic layers (such as but not limited to organic photoresist layers and organic polymer based Anti-Reflective Coating (ARC) layers) and inorganic layers (such as but not limited to reflective metal layers upon whose surfaces are formed organic photoresist layers and organic polymer based ARC layers). Methods and materials through which such interfacial adhesion problems have typically been addressed within integrated circuits have commonly employed coating between the adjoining organic and inorganic layers an adhesion promoter layer. The adhesion promoter layer is typically formed from an adhesion promoter material which may be ordered within the adhesion promoter layer to simultaneously exhibit a chemical affinity for both the organic layer and the inorganic layer. A common, although not exclusive, adhesion promoter material employed in forming adhesion promoter layers within integrated circuits is Hexa-Methyl-Di-Silazane (HMDS).

Although problems related to overexposure of portions of photoresist layers formed upon reflective layers within integrated circuits and problems related to interfacial adhesion between organic layers and inorganic layers within integrated circuits are substantially unrelated, and are typically resolved by substantially unrelated methods and materials, those two problems often occur simultaneously within integrated circuit processing. In order to provide optimal manufacturing efficiency it is thus desirable within integrated circuit manufacture to provide methods and materials through which problems related to overexposure of portions of photoresist layers and problems related to organic/inorganic interfacial adhesion may be simultaneously addressed. It is toward that goal that the present invention is generally directed.

Although typically not conventionally employed with integrated circuit manufacture, there has recently been disclosed within the art of forming ordered thin film layers with desirable physical and/or chemical properties the use of Langmuir-Blodgett (LB) films and Langmuir-Blodgett (LB) methods. For example, U.S. Pat. No. 5,301,069 to Wood et al teaches the use of Langmuir-Blodgett (LB) films in a light-limiting filter to protect optical sensors. U.S. Pat. No. 5,225,274 to Ogawa et al teaches the use of an LB film as a water-repelling, oil-repelling, anti-fogging, and anti-contaminating film.

Desirable in the art of integrated circuit manufacture are methods through which Langmuir-Blodgett techniques may be employed in forming ordered films which simultaneously minimize overexposures of portions organic photoresists formed upon reflective inorganic layers, such as metal layers, and promote the adhesion of those organic photoresist layers upon those reflective inorganic layers. It is towards that goal that the present invention is specifically directed.

SUMMARY OF THE INVENTION

A principal object of the present invention is to provide an effective and very manufacturable method of forming an anti-reflective coating in the fabrication of an integrated circuit.

A further object of the invention is to provide a method of forming an anti-reflective coating upon a reflective layer, such as a reflective conducting layer, the antireflective coating also acting as an adhesion promoter between the reflective layer and an organic layer, such as an organic photoresist layer, formed over the reflective layer.

Yet another object is to provide a method of forming an anti-reflective coating that also acts as an adhesion promoter that is easy to control through monolayer to multilayer.

A still further object of the invention is to provide a method of forming an anti-reflective coating that also acts as an adhesion promoter that is easy to assemble and to recover.

In accordance with the objects of this invention a method for patterning a conducting layer in the fabrication of an integrated circuit is achieved. A conducting layer is provided over semiconductor device structures in and on a semiconductor substrate. A Langmuir-Blodgett film is formed and coated through a Langmuir-Blodgett method onto the conducting layer, wherein the Langmuir-Blodgett film acts simultaneously as an anti-reflective coating and as an adhesion promoter. A layer of photoresist is coated over the Langmuir-Blodgett film and patterned to provide a photoresist mask. The conducting layer is etched away where it is not covered by the photoresist mask and the photoresist mask is removed to complete the conducting layer patterning in the fabrication of an integrated circuit.

The present invention provides an effective and very manufacturable method for forming an antireflective coating upon a reflective layer, such as a reflective conducting layer, where the antireflective coating also acts as an adhesion promoter between the reflective layer and an organic layer, such as an organic photoresist layer formed over the reflective layer, in the fabrication of an integrated circuit. Through the method there is formed a Langmuir-Blodgett film through a Langmuir-Blodgett method onto a conducting layer, The Langmuir-Blodgett film is formed from a dye surfactant which may be ordered through the LB method in a fashion such that the LB film forms simultaneously an antireflective layer with respect to the conducting layer and adhesion promoter layer with respect to a photoresist layer subsequently formed upon the conducting layer.

The invention provides a method for forming an antireflective coating that also acts as an adhesion promoter which is easy to assemble, control through mono-layer to multi-layer, and recover. Although not typically employed within integrated circuit manufacture, the LB method through which a LB film may be formed upon a substrate layer is known in the art of thin films to provide a LB film which is easy to assemble upon the substrate layer, control through mono-layer to multi-layer upon the substrate layer, and recover from the substrate layer. Through the method of the invention a LB film is formed upon a reflective layer within an integrated circuit, while employing a dye surfactant molecule in forming the LB film. Since the LB method does not inferentially discriminate against an integrated circuit as a substrate when forming a LB film, the method of the invention thus provides a method for forming an antireflective coating that also acts as an adhesion promoter which is easy to assemble, control through mono-layer to multi-layer, and recover.

BRIEF DESCRIPTION OF THE DRAWINGS

In the accompanying drawings forming a material part of this description, there is shown:

FIGS. 3A, 3B, 4 and 5 schematically illustrate in cross-sectional representation the process of forming an LB film within a Langmuir trough through the method of the present invention.

DESCRIPTION OF THE PREFERRED EMBODIMENTS

Figure 1:
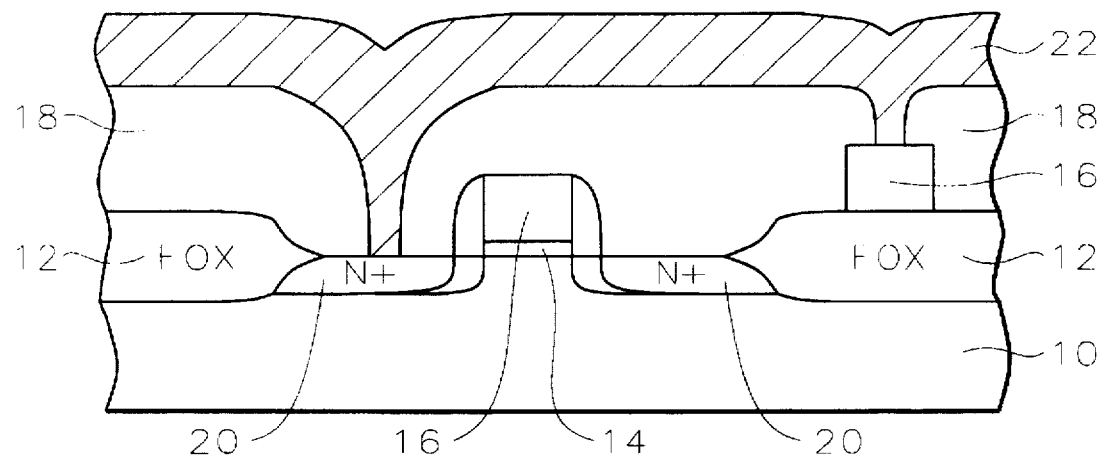
FIGS. 1 and 9 through 12 schematically illustrate in cross-sectional representation a preferred embodiment of the present invention.

The drawing figures provide an illustration of a typical semiconductor device patterning. It should be understood that this invention is not limited to the particular semiconductor device patterning shown in FIGS. 1 and 9-12, but is equally applicable to any type or level of patterning using a photoresist on a reflective surface within an integrated circuit to simultaneously provide an ARC on the reflective surface and an adhesion promoter between the reflective surface and the photoresist.

Referring now more particularly to FIG. 1, there is shown an illustration of a portion of a partially completed integrated circuit. The semiconductor substrate 10 is preferably composed of silicon having a (100) crystallographic orientation. Field Oxide regions 12 are formed as are conventional in the art. The surface of the silicon substrate 10 is thermally oxidized to form the gate oxide layer 14. Polysilicon gate electrodes 16, is patterned and etched as is conventional in the art. Insulating layer 18 is deposited over the gate electrodes 16. Openings are made through the insulating layer 18, for example, to source and drain regions 20 and gate electrodes, as shown, where electrical connections are to be made. A metal layer 22 is deposited over the insulating layer 18 and within the contact openings.

Now, the LB film of the present invention is to be coated onto the metal layer 22 to be patterned. The LB film will act as both an anti-reflective coating and as an adhesion promoter.

Figure 2:
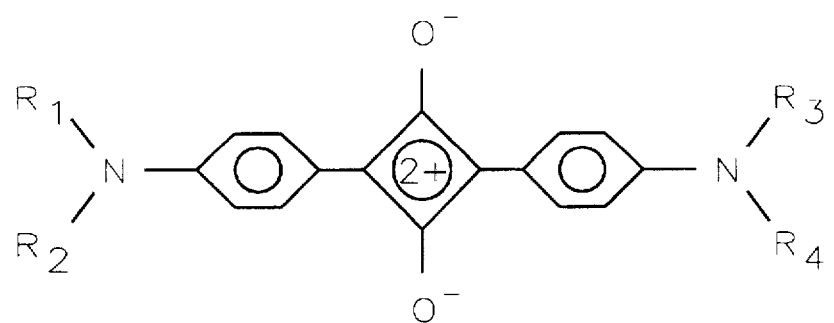
FIG. 2 illustrates the chemical formula for a dye surfactant used in the process of the invention.

Dye surfactant molecules such as squaraine derivatives of the general formula shown in FIG. 2 can form LB films in different orientations and aggregations under different experimental conditions. The orientation of a dye surfactant molecule within an LB monolayer formed upon the surface of a solvent relates to the character of the solvent. Hydrophobic tail groups of dye surfactant molecules will orient upward in aqueous solvents. Hydrophobic tail groups of dye surfactant molecules will orient downward in hydrophobic solvents. For proper operation of the invention the final orientation of an LB film formed from a series of dye surfactant molecules upon a reflective surface must have exposed hydrophobic tail groups of the dye surfactant molecules. In addition, dye surfactant molecules other than squaraine derivatives can be used. What is needed with respect to the present invention, in the dye surfactant molecule is (1) a minimum of one hydrophilic head group, (2) a minimum of one hydrophobic tail group, and (3) a minimum of one chromophore group which absorbs at the exposure wavelength of a photoresist layer formed over a reflective inorganic layer upon which is formed an LB film of the dye surfactant molecule.

The general formula of the squaraine dye surfactant derivatives which may be employed in forming LB films of the preferred embodiments of the method of the invention is illustrated in FIG. 2.

FIG. 3A illustrates a first orientation of an LB film formed from a squaraine derived dye surfactant molecule of the general formula shown in FIG. 2 where: $R_1=R_2=CH_3$ (ie methyl) and $R_3=R_4=n-C_{18}H_{37}$ (DSSQ) (ie normal octadecyl), where "n" is an abbreviation for "normal" which means that the $C_{18}$ chain is not branched, and is straight. The normal octadecyl forms the hydrophobic tail groups within the squaraine derived dye surfactant molecule of general formula of FIG. 2. In FIG. 3A, 50 is water and 52 is air. The chromophore group 54 and the hydrophobic tail groups 56 are substantially perpendicular to the surface of the water 50 while the chromophore group 54 is partially submerged within the water 50. The hydrophilic head groups 58 are substantially planer with the surface of the water.

A second orientation of an LB film formed from a squaraine derived dye surfactant molecule of the general formula shown in FIG. 2 is illustrated in FIG. 3B where $R_1=R_3=CH_3$ and $R_2=R_4=n-C_{18}H_{37}$ (MSSQ). In FIG. 3B, where 50 is water and 52 is air, the chromophore group 54 and the hydrophilic head groups 58 are substantially made parallel to the surface of the water 50 and more completely submerged within the water 50 while the hydrophobic tail groups still 56 extend into the air, 52.

The LB film of the squaraine derived dye surfactant molecule is formed by spraying a solution of the dye surfactant molecule (about $10^{-3}$) onto water 50, as illustrated in FIG. 4 where reference numeral 55 indicates the complete squaraine derived dye surfactant molecule. However, generally speaking when we speak of water 50, we refer to an aqueous subphase. The aqueous subphase contains cadmium chloride (about $3\times10^{-4}$ m) and sodium bicarbonate (about $5 \times 10^{-4}$ m & pH of 6.8). For surfactant squaraine, we found no difference between pure water and the aqueous subphase and in some cases water was even better. Typically the dye surfactant molecule solution is formed with a solvent which is readily evaporated from a water 50 surface. Chloroform is the common solvent for the squaraine derived dye surfactant molecules 55. As illustrated in FIG. 5, the water 50 is contained within a Langmuir trough 51 which has a movable float 53 and a piezotransducer (not shown) which pressure the mono-layer LB film to the upright compressed structure. A typical pressure needed to compress the squaraine derived dye surfactant molecule 55 to the upright compressed structure of FIG. 5 is between about 20 to 30 dynes/cm and typically 25 dynes/cm.

Typically, the water 50 (see above for meaning) contained within the Langmuir trough 51 will be deionized water of sufficient quality such that adventitious contaminants are not deposited upon the hydrophilic and/or hydrophobic surfaces of a wafer which is subsequently immersed into and withdrawn from water 50 contained within the Langmuir trough 51. The depth of the water 50 within the Langmuir trough 51 must be sufficient such that the wafer may be completely immersed within the water 50 within the Langmuir trough 51. The water 50 within the Langmuir trough 51 is typically maintained at a temperature of between about 15 to 30° C. (typically 25° C.).

With regard to the surface area of the water 50 within the Langmuir trough 51 it is preferred that the surface area of the water 50 within the Langmuir trough 51 is at least about 5 (for a single layer) to 10 (for a multi-layer) times the total surface area of the LB film expected to be transferred to both surfaces of the wafer subsequently immersed within and withdrawn from the Langmuir trough 51. Under such conditions, the float 53, as illustrated in FIG. 5 will typically maintain a uniform lateral pressure upon the LB film as the LB film is transferred onto the hydrophilic and/or hydrophobic surfaces of the wafer.

With regard to measurement of the hydrophilic and the hydrophobic characteristics of the surfaces of the wafer, which may include but are not limited to the hydrophilic and the hydrophobic characteristics of a conductive metal layer formed over a wafer (for example but without limitation, the metal layer 22 formed over the silicon substrate 10 as illustrated in FIG. 1), it is preferred that a hydrophilic surface of the wafer or the metal layer preferably has a sessile DI water drop contact angle of no greater than about 85 degrees and that a hydrophobic surface of the wafer or the metal layer preferably has a sessile DI water drop contact angle of no less than about 95 degrees. More preferably the hydrophobic surface has a sessile DI water drop contact angle no less than about 110 degrees. Under such conditions, a monolayer of the LB film will be cleanly formed upon the hydrophilic surface of the wafer or the metal layer and a bilayer of the LB film will be cleanly formed upon the hydrophobic surface of the wafer or the metal layer when the wafer or the wafer having the metal layer formed thereover is immersed into and withdrawn from the water 50 within the Langmuir trough 51, upon the surface of which water 50 is formed the LB film of the squaraine derived dye surfactant molecule 55 whose general formula is illustrated in FIG. 2. The LB film is preferably formed onto the wafer by immersing the wafer or the wafer having the metal layer formed thereover vertically into the water 50 within the Langmuir trough 51.

Figure 6A:
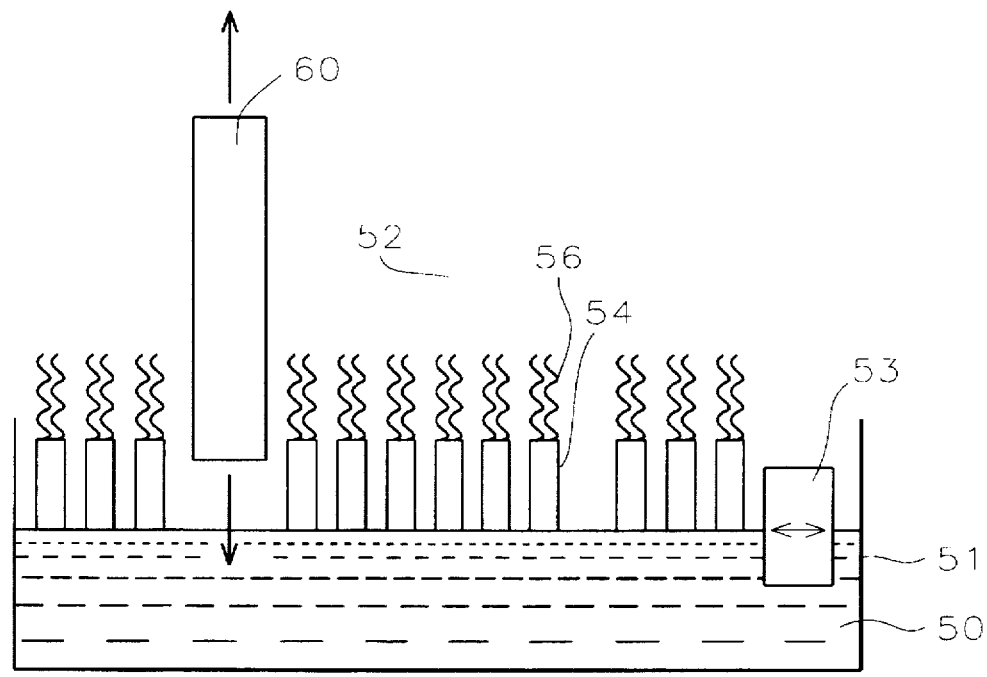
FIGS. 6A and 6B schematically illustrate in cross-sectional representation a first method of coating an LB film on a wafer having two hydrophilic surfaces in the process of the present invention.
Figure 6B:
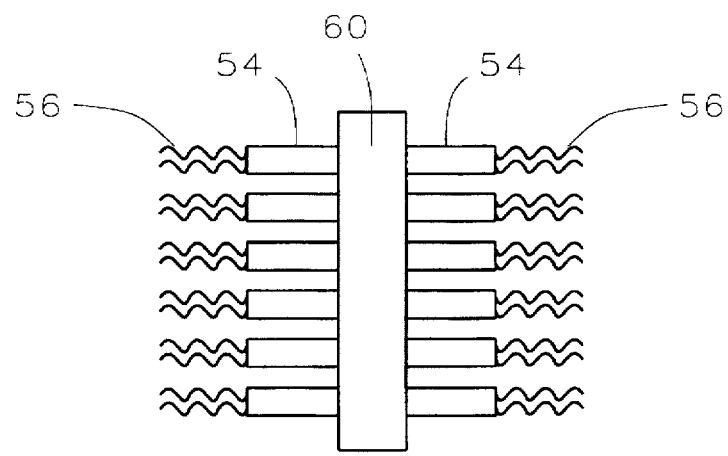
Figure 7A:
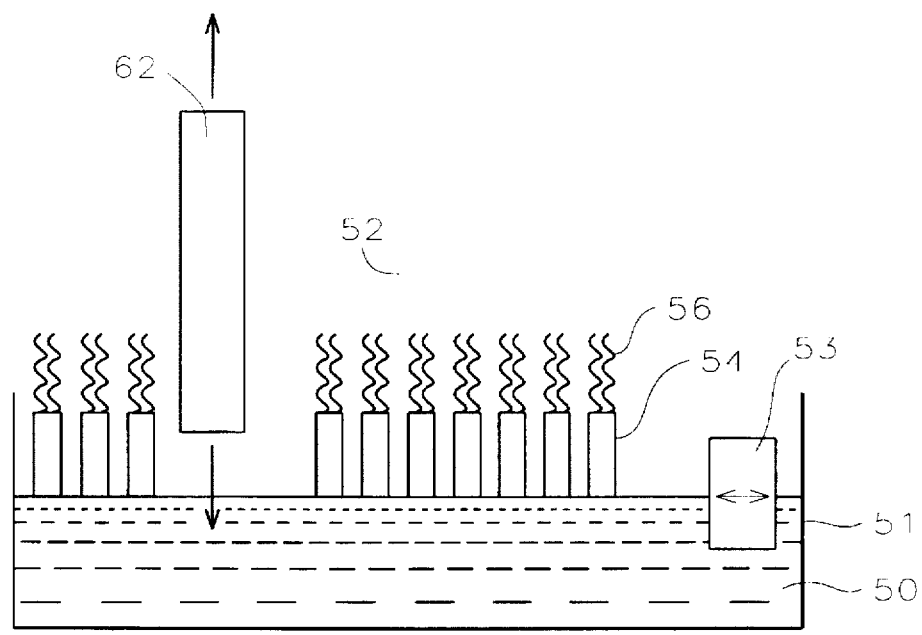
FIGS. 7A and 7B schematically illustrate in cross-sectional representation a second method of coating an LB film on a wafer having two hydrophobic surfaces in the process of the present invention.
Figure 7B:
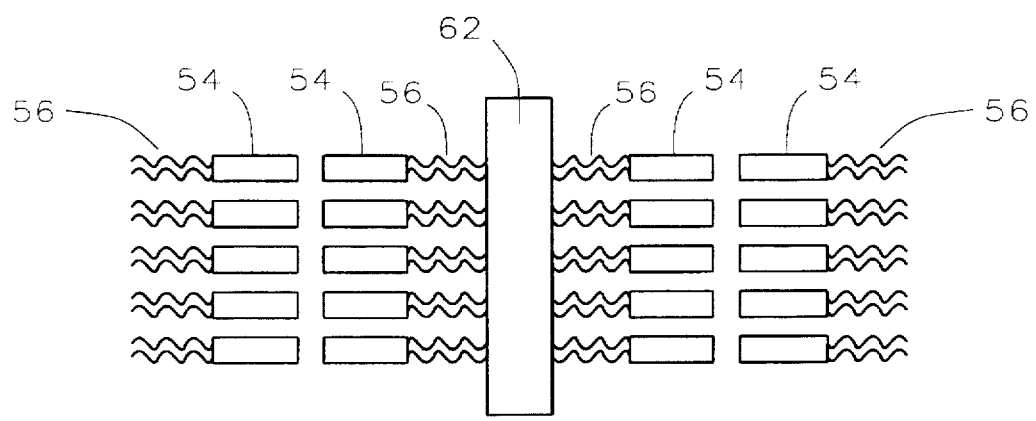

As illustrated in FIGS. 6A and 6B for a wafer 60 with two hydrophilic reflective surfaces, insertion and removal of wafer 60 will yield upon each side of the wafer 60 a monolayer with exposed hydrophobic tail groups 56. As illustrated in FIGS. 7A and 7B for a wafer 62 with two hydrophobic reflective surfaces, insertion and removal of wafer 62 will yield upon each side of the wafer 62 a bilayer with exposed hydrophobic tail groups 56. It is also possible to have a wafer with one hydrophilic reflective surface and one hydrophobic reflective surface.

The LB film is preferably coated onto the substrate surface by immersing the wafer vertically into the solvent. FIG. 6A illustrates the immersion of a wafer 60 having two hydrophilic surfaces. FIG. 7A illustrates the immersion of a wafer 62 having two hydrophobic surfaces. After the wafer 60 or 62 is pulled out of the water 50 within the Langmuir trough 51, the monolayer or bilayer LB film from the back side of the wafer may be removed with a suitable solvent such as, but not limited to dichloromethane ($CH_2C_{l2}$) or through an ashing process such as, but not limited to an oxygen ashing process. Where only one side of the wafer is desired to have the LB film, a scrubber (for example a brush scrubber) can be used to wipe off the LB film from the backside of that wafer.

Figure 8A:
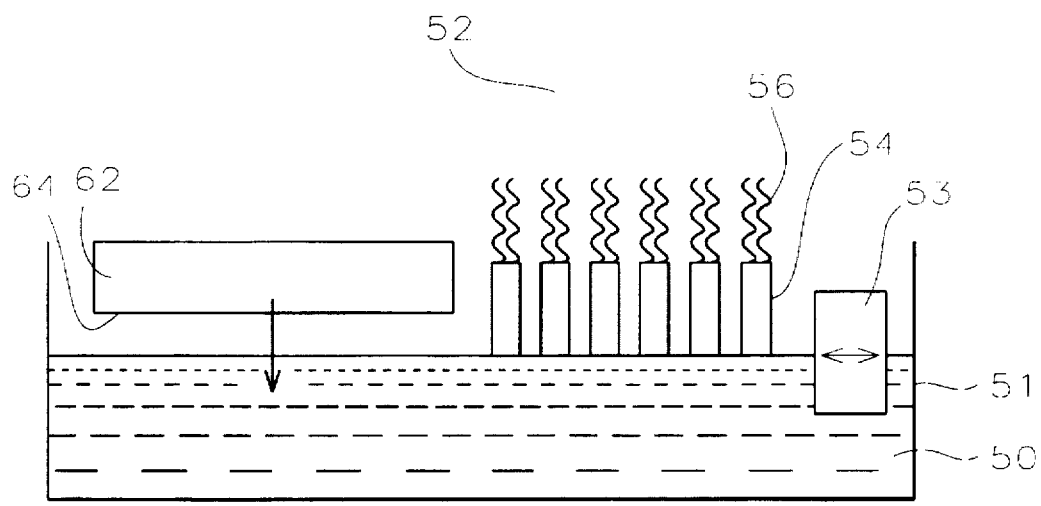
FIGS. 8A and 8B schematically illustrate in cross-sectional representation a third method of coating an LB film on a wafer having at least one hydrophobic surface in the process of the present invention.
Figure 8B:
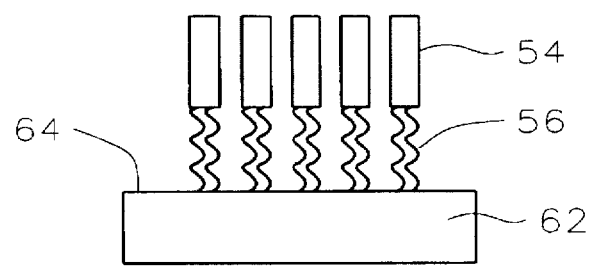

Alternatively, the wafer 62 can be immersed horizontally and face down onto the LB film within the water 50 within the Langmuir trough 51, as illustrated in FIG. 8A. Here, a hydrophobic surfaced wafer 62 is immersed into the water 50 with the face 64 down, yielding a wafer having exposed hydrophilic heads 54. The method and structure as illustrated within FIGS. 8A and 8B is neither typical nor common, since it is generally preferred when forming adhesion promoter layers to have exposed hydrophobic tail groups, not exposed hydrophilic head groups.

Whether the wafer (reflective surface) is hydrophobic or hydrophilic will determine (in conjunction with the solvent upon whose surface the dye surfactant LB film is formed) whether one obtains a monolayer or a bilayer when immersing and removing the wafer from the solvent. The surface pressure through the moving float 53 (and pressure transducer) maintains lateral pressure on the dye surfactant to keep the dye surfactant ordered into an LB film. The immersion time is not important, but the immersion and withdrawal rate is important. The immersion/withdrawal rate should not compromise the kinetics of adsorption in forming either the monolayer or bilayer film on the reflective substrate. Immersion/withdrawal rate should also not compromise the transducer feedback in making the float 53 maintain constant lateral pressure. The operative immersion and withdrawal rate is between about 1 mm/min. to 100 mm/min. and the preferred rate is about 10 mm/min. The preferred constant lateral pressure is between about 20 to 30 dynes/cm and typically 25 dynes/cm.

The definition of DSSQ is 4-(distearylamino) phenyl-4'-(dimethylamino)phenylsquaraine and MSSQ is bis(4-methyl-stearylamino)phenyl)squaraine.

FIG. 6B illustrates the monolayer LB film on the wafer 60 surface after immersion according to FIG. 6A. The chromophore groups 54 serve as the anti-reflective component of the monolayer LB film and the hydrophobic tail group 56 simultaneously serve as an adhesion promoter and moisture protector within the monolayer LB film formed upon the wafer 60.

FIG. 7B illustrates the LB bilayer films of the dye surfactant molecules 55 on the wafer 62 surfaces after immersion according to FIG. 7A, and also shows the chromophore groups 54 which serve as the anti-reflective component of the bilayer LB films and the hydrophobic tail groups 56 which serve as an adhesion promoter and moisture protector. The wafer surface in FIG. 7B is hydrophobic. With a hydrophobic wafer surface and water solvent 50, one monolayer of squaraine derived dye surfactant molecule 55 is coated thereon when the wafer is immersed and a second counteropposed monolayer is coated when the wafer is removed. Thus there is formed a bilayer of the squaraine derived surfactant molecule 55 upon a hydrophobic wafer surface. For hydrophilic wafer, no monolayer is coated when the wafer is immersed and one monolayer is coated when the wafer is removed.

FIG. 8B illustrates the monolayer LB film on the hydrophilic surface 64 of the wafer 62 after immersion according to FIG. 8A. Also illustrated within FIG. 8B are the chromophore groups 54 which serve as the anti-reflective component of the monolayer LB film and the reversed hydrophilic tail groups 56 which simultaneously serves as an adhesion promoter and moisture protector.

As is understood by a person skilled in the art, several monolayers of LB film may be necessary to provide an adequate anti-reflective coating upon the reflective surface of a hydrophilic wafer 60 or hydrophobic wafer 62. The number of coatings can be determined through measuring the reflectivity of the reflective substrate after coating with the LB monolayer or bilayer films. Typically and preferably a number of monolayers is added to the reflective surface such that the reflectivity of the reflective layer is less than about 50% to 80% at the exposure wavelength of the photoresist employed in the patterning of the reflective layer.

With respect to tuning the absorption of the LB film, surfactant molecule used in creating the LB film may need to be determined depending upon ARC use. Although the preferred embodiments of the present invention disclose squaraine derived dye surfactant molecules which bridge substituted aniline chromophore groups, other types of dye the type of dye surfactant molecules may also be employed within the method of the invention, thus providing an LB film with a tunable optical absorption. In choosing alternative dye surfactant molecules, it is preferred to choose chromophore groups within the dye surfactant molecules which absorb strongly at the photoexposure wavelength of a photoresist employed in patterning the reflective layer upon which is formed the LB film. Such alternative dye surfactant molecules may include chromophore groups such as but not limited to stilbene and cyanine chromophore groups. Such alternative dye surfactant molecules may also include alternative hydrophilic head groups, including but not limited to quartinary ammonium groups and carboxylic acid groups. Hydrophobic tail groups derived from $C_{10}$–$C_{18}$ wherein normal alkanes are typical and preferred, although not exclusive, within alternative dye surfactant molecules which may be employed within the method of the invention.

Figure 9:
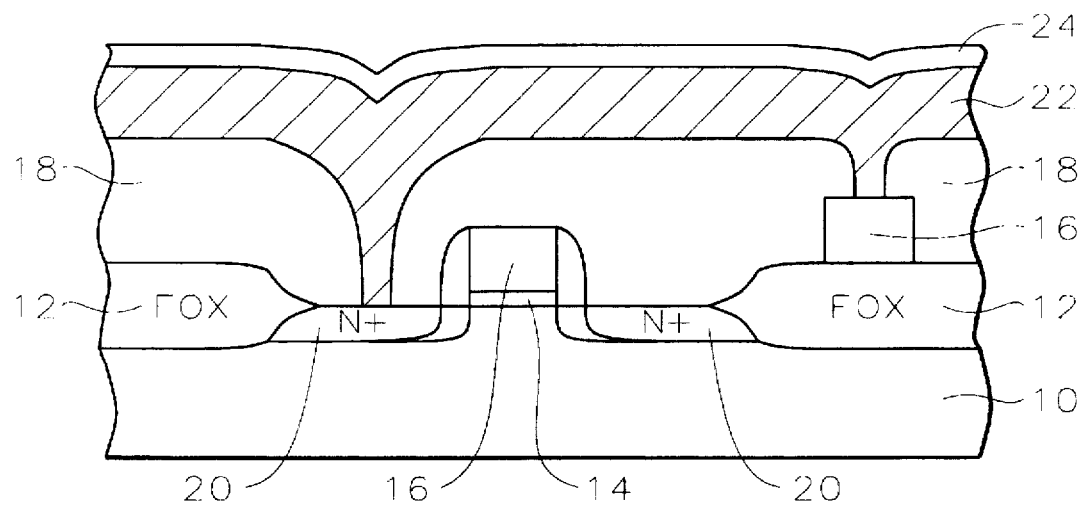
Figure 10:
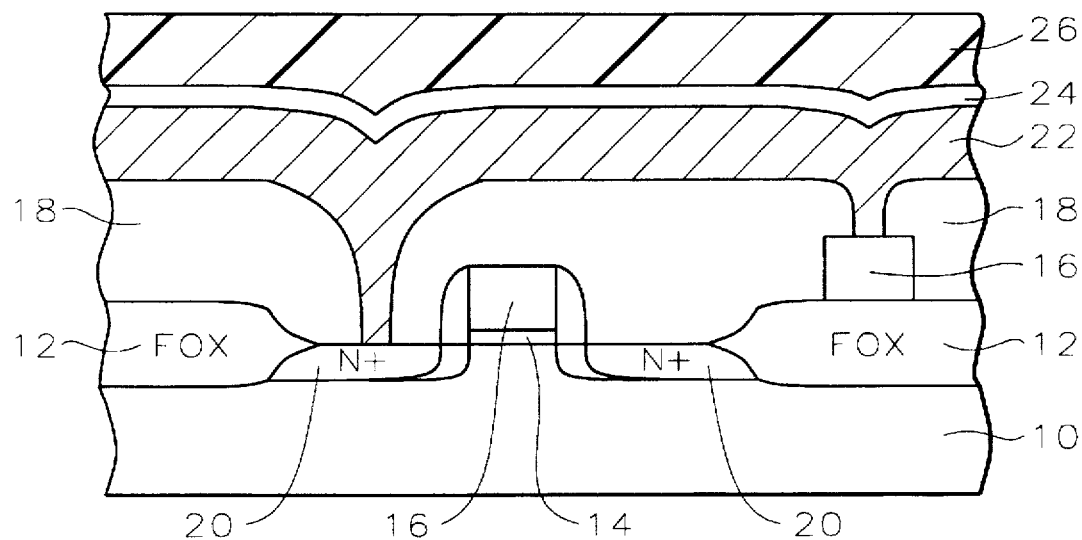
Figure 11:
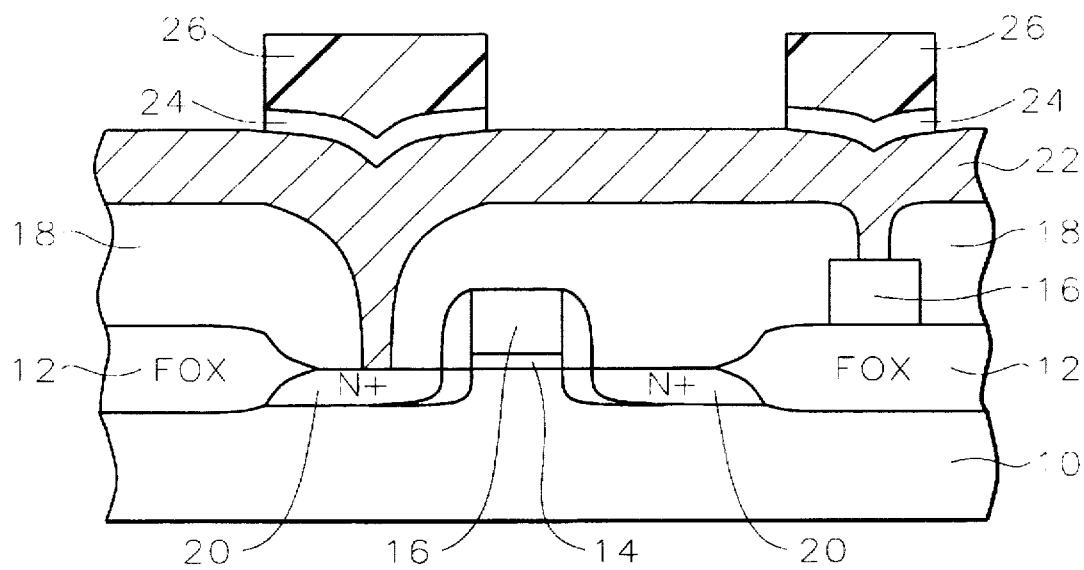
Figure 12:
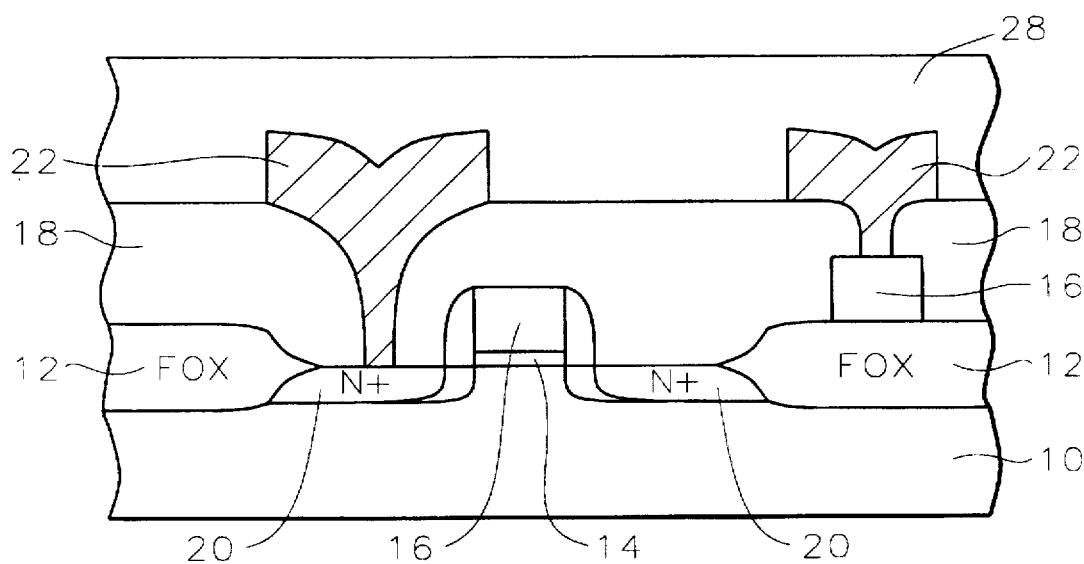

FIG. 9 illustrates the LB film 24 coated on the surface of the metal layer 22. The structure as illustrated in FIG. 9 typically corresponds with the wafer 60 or wafer 62 after immersion into and withdrawal from the Langmuir trough 51 as shown in FIG. 5. Next, the photoresist 26 is applied, as shown in FIG. 10. Portions of the photoresist 26 are exposed to actinic light and then developed. The portion of the LB film 24 exposed when developing the photoresist layer 26 can often be removed by the developer sequentially with development of the photoresist 26, as shown in FIG. 11. The remaining portions of the LB film 24 may be removed easily by an organic solvent such as $CH_2Cl_2$ or by oxygen ashing, after metal layer 22 etching when the photoresist is removed, as shown in FIG. 12.

The integrated circuit device is completed as is conventional in the art, either with a passivation layer 28 or further metallization layers.

The process of the invention provides an effective, low cost method of patterning a conducting layer in the fabrication of an integrated circuit device. The LB film provides an anti-reflective coating during photolithography that is easy to assemble and to recover. The LB film is easy to control through monolayer to multilayer. Furthermore, the LB film simultaneously acts as an adhesion promoter.

While the invention has been particularly shown and described with reference to the preferred embodiments thereof, it will be understood by those skilled in the art that various changes in form and details may be made without departing from the spirit and scope of the invention.

What is claimed is:

1. The method of metal patterning in the fabrication of an integrated circuit comprising:

providing a semiconductor substrate having semiconductor device structures formed in and on said semiconductor substrate;

depositing a metal layer over said semiconductor substrate;

coating onto said metal layer a Langmuir-Blodgett film formed through a Langmuir-Blodgett method wherein said Langmuir-Blodgett film acts as an anti-reflective coating and as an adhesion promoter, said Langmuir-Blodgett film being formed from a dye surfactant comprising a hydrophilic group, a chromatic group and a hydrophobic group;

coating said Langmuir-Blodgett film with a photoresist and patterning said photoresist to provide a photoresist mask;

etching away said metal layer where it is not covered by said photoresist mask; and removing said photoresist mask completing said metal patterning in the fabrication of said integrated circuit.

2. The method according to claim 1 wherein said forming said Langmuir-Blodgett film through said Langmuir-Blodgett method comprises the steps of:

spraying said dye surfactant onto a surface of water within a Langmuir trough; and compressing laterally said dye surfactant on said surface of water within said Langmuir trough with a moveable float upon said surface of water within said Langmuir trough, wherein said dye surfactant forms a Langmuir-Blodgett ordered monolayer within and upon said surface of water, wherein said hydrophilic group forms a hydrophilic head at least partially within said surface of water and wherein said hydrophobic group forms a hydrophobic tail extending from said surface of water.

3. The method according to claim 2 wherein said dye surfactant is chosen from the group of dye surfactants consisting of a squaraine derivative dye surfactant, stilbene derivative dye surfactants and cyanine derivative dye surfactants.

4. The method according to claim 1 wherein said coating said Langmuir-Blodgett film onto said metal layer comprises the steps of:

vertically immersing said substrate into said Langmuir-Blodgett trough wherein said Langmuir-Blodgett film is coated on the surface of said substrate; and removing said Langmuir-Blodgett film from the backside of said substrate.

5. The method according to claim 1 wherein said metal layer is a hydrophilic metal layer and said Langmuir-Blodgett film is coated onto said hydrophilic metal layer to a thickness of one monolayer.

6. The method according to claim 5 wherein said hydrophilic metal layer has a sessile deionized water drop contact angle of no greater than about 85 degrees.

7. The method according to claim 1 wherein said metal layer is a hydrophobic metal layer and said Langmuir-Blodgett film is coated onto said hydrophobic metal layer to a thickness of two monolayers.

8. The method according to claim 7 wherein said hydrophobic metal layer has a sessile deionized water drop contact angle of no less than about 95 degrees.

9. The method according to claim 1 wherein said photoresist is patterned by:

exposing said photoresist to actinic light;

developing said photoresist wherein said photoresist not exposed to said actinic light is removed; and wherein said developing said photoresist also removes said Langmuir-Blodgett film under said removed photoresist.

10. The method according to claim 1 wherein said photoresist is patterned by:

exposing said photoresist to actinic light;

developing said photoresist wherein said photoresist exposed to said actinic light is removed; and wherein said developing said photoresist also removes said Langmuir-Blodgett film under said removed photoresist.

11. The method according to claim 1 wherein after removing said photoresist mask, said Langmuir-Blodgett film is removed by a solvent.

12. The method according to claim 1 wherein after removing said photoresist mask, said Langmuir-Blodgett film is removed by a oxygen ashing.

13. The method according to claim 1 wherein said Langmuir-Blodgett film is removed during removal of said photoresist mask.

14. The method of fabricating an integrated circuit device comprising:

providing a semiconductor substrate having semiconductor device structures formed in and on the semiconductor substrate, wherein said semiconductor device structures include gate eletrodes and source and drain regions;

depositing a metal layer over said semiconductor substrate;

coating onto said metal layer a Langmuir-Blodgett film formed through a Langmuir-Blodgett method wherein said Langmuir-Blodgett film acts as an anti-reflective coating and as an adhesion promoter, said Langmuir-Blodgett film being formed from a dye surfactant comprising a hydrophilic group, a chromatic group and a hydrophobic group;

coating said Langmuir-Blodgett film with photoresist and patterning said photoresist to provide a photoresist mask;

etching away said metal layer where it is not covered by said photoresist mask; and removing said photoresist mask completing said metal patterning in the fabrication of said integrated circuit.

15. The method according to claim 14 wherein said coating said Langmuir-Blodgett film through said Langmuir-Blodgett method comprises the steps of:

spraying said dye surfactant onto a surface of water within a Langmuir trough; and compressing laterally said dye surfactant on said surface of water within said Langmuir trough with a moveable float upon said surface of water within said Langmuir trough, wherein said dye surfactant forms a Langmuir-Blodgett ordered monolayer within and upon said surface of water, wherein said hydrophilic group forms a hydrophilic head at least partially within said surface of water and wherein said hydrophobic group forms a hydrophobic tail extending from said surface of water.

16. The method according to claim 15 wherein said dye surfactant is chosen from the group of dye surfactants consisting of a squaraine derivative dye surfactant, stilbene derivative dye surfactants and cyanine derivative dye surfactants.

17. The method according to claim 14 wherein said coating said Langmuir-Blodgett film onto said metal layer comprises the steps of:

vertically immersing said substrate into said Langmuir-Blodgett trough wherein said Langmuir-Blodgett film is coated on the surface of said substrate; and removing said Langmuir-Blodgett film from the backside of said substrate.

18. The method according to claim 14 wherein said metal layer is a hydrophilic metal layer and said Langmuir-Blodgett film is coated onto said hydrophilic metal layer to a thickness of one monolayer.

19. The method according to claim 18 wherein said hydrophilic metal layer has a sessile deionized water drop contact angle of no greater than about 85 degrees.

20. The method according to claim 14 wherein said metal layer is a hydrophobic metal layer and said Langmuir-Blodgett film is coated onto said hydrophobic metal layer to a thickness of two monolayers.

21. The method according to claim 20 wherein said hydrophobic metal layer has a sessile deionized water drop contact angle of no less than about 95 degrees.

22. The method according to claim 14 wherein said photoresist is patterned by:

exposing said photoresist to actinic light;

developing said photoresist wherein said photoresist not exposed to said actinic light is removed; and wherein said developing said photoresist also removes said Langmuir-Blodgett film under said removed photoresist.

23. The method according to claim 14 wherein said photoresist is patterned by:

exposing said photoresist to actinic light;

developing said photoresist wherein said photoresist exposed to said actinic light is removed; and wherein said developing said photoresist also removes said Langmuir-Blodgett film under said removed photoresist.

24. The method according to claim 14 wherein after removing said photoresist mask, said Langmuir-Blodgett film is removed by a solvent.

25. The method according to claim 14 wherein after removing said photoresist mask, said Langmuir-Blodgett film is removed by a oxygen ashing.

26. The method according to claim 14 wherein said 5 Langmuir-Blodgett film is removed during removal of said photoresist mask.

* * * * *